(12) United States Patent
Orikasa et al.

(10) Patent No.: US 10,304,779 B2
(45) Date of Patent: May 28, 2019

(54) ELECTRONIC COMPONENT MODULE HAVING A PROTECTIVE FILM COMPRISING A PROTECTIVE LAYER AND A LOW REFLECTIVITY LAYER HAVING A ROUGH OUTER SURFACE AND MANUFACTURING METHOD THEREOF

(71) Applicant: TDK Corporation, Tokyo (JP)

(72) Inventors: Makoto Orikasa, Tokyo (JP); Yuhei Horikawa, Tokyo (JP); Hisayuki Abe, Tokyo (JP); Yoshihiro Kanbayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 18 days.

(21) Appl. No.: 15/791,888

(22) Filed: Oct. 24, 2017

(65) Prior Publication Data

US 2018/0114759 A1    Apr. 26, 2018

Related U.S. Application Data

(60) Provisional application No. 62/412,371, filed on Oct. 25, 2016.

(51) Int. Cl.
| | |
|---|---|
| *H01L 23/552* | (2006.01) |
| *H01L 21/3205* | (2006.01) |
| *H01L 21/56* | (2006.01) |
| *H01L 21/288* | (2006.01) |
| *H01L 23/31* | (2006.01) |
| *H01L 23/00* | (2006.01) |

(52) U.S. Cl.
CPC ...... *H01L 23/552* (2013.01); *H01L 21/32051* (2013.01); *H01L 21/565* (2013.01); *H01L 21/288* (2013.01); *H01L 23/3121* (2013.01); *H01L 24/32* (2013.01); *H01L 24/48* (2013.01); *H01L 24/73* (2013.01); *H01L 2224/32225* (2013.01); *H01L 2224/48091* (2013.01); *H01L 2224/48106* (2013.01); *H01L 2224/48227* (2013.01); *H01L 2224/48472* (2013.01); *H01L 2224/73265* (2013.01); *H01L 2924/00014* (2013.01); *H01L 2924/181* (2013.01)

(58) Field of Classification Search
CPC ............ H01L 23/552; H01L 21/32051; H01L 21/565; H01L 23/3121; H01L 31/02164; H01L 31/02168
See application file for complete search history.

(56) References Cited

U.S. PATENT DOCUMENTS

| | | | |
|---|---|---|---|
| 9,269,673 B1 * | 2/2016 | Lin | ................. H01L 24/97 |
| 2004/0125430 A1 * | 7/2004 | Kasajima | .......... G02F 1/133536 |
| | | | 359/247 |
| 2012/0187585 A1 | 7/2012 | Yamazaki | |
| 2016/0027740 A1 | 1/2016 | Chiu et al. | |

FOREIGN PATENT DOCUMENTS

JP    2012-151326 A    8/2012

* cited by examiner

*Primary Examiner* — Laura M Menz
*Assistant Examiner* — Candice Chan
(74) *Attorney, Agent, or Firm* — Young Law Firm, P.C.

(57) ABSTRACT

Disclosed herein is an electronic component module that includes, an electronic component, a mold resin that seals the electronic component, a conductive film that covers the mold resin, and a protective film that covers the conductive film. The protective film includes a protective layer and a low reflective layer, and the low reflective layer is free from contacting the conductive film.

7 Claims, 7 Drawing Sheets

| | PROTECTION FILM (μm) | | CONTACT BETWEEN CONDUCTIVE FILM AND LOW-REFRACTIVE LAYER | REFRACTANCE (%) | IMAGE ANALYSIS | ADHESION |
|---|---|---|---|---|---|---|
| | PROTECTION LAYER | LOW-REFRACTIVE LAYER | | | | |
| EXAMPLE 1 | 2 | 0.3 | NO | 3.8 | ◎ | 2 |
| EXAMPLE 2 | 2 | 0.2 | NO | 4.5 | ◎ | 2 |
| EXAMPLE 3 | 2 | 0.1 | NO | 10 | ○ | 2 |
| EXAMPLE 4 | 2 | 0.05 | NO | 20.3 | ○ | 2 |
| EXAMPLE 5 | 2 | 0.2 | NO | 4.1 | ◎ | 1 |
| COMPARATIVE EXAMPLE 1 | 2 | - | - | 51 | × | 2 |
| COMPARATIVE EXAMPLE 2 | 2 | 0.1 | YES | 9.5 | ◎ | 5 |
| COMPARATIVE EXAMPLE 3 | 2 | 0.05 | YES | 20.8 | ○ | 3 |
| COMPARATIVE EXAMPLE 4 | 2 | 0.02 | YES | 33 | × | 3 |

FIG. 9

ELECTRONIC COMPONENT MODULE HAVING A PROTECTIVE FILM COMPRISING A PROTECTIVE LAYER AND A LOW REFLECTIVITY LAYER HAVING A ROUGH OUTER SURFACE AND MANUFACTURING METHOD THEREOF

BACKGROUND OF THE INVENTION

Field of the Invention

The present invention relates to an electronic component module and its manufacturing method.

Description of Related Art

In order to prevent leakage of electromagnetic wave noise generated from an electronic component incorporated in an electronic component module, etc., and to prevent entrance of electromagnetic wave noise generated from the surrounding environment, the outer periphery of electronic component is covered with an electromagnetic wave shield made of a metal film. In recent years, in order to fulfill the requirements of miniaturization and higher performance for an electronic component, the electromagnetic wave shield is also required to achieve miniaturization and higher performance.

There is disclosed a technology that directly forms a metal film on the surface of the electronic component module to achieve space reduction.

For example, an electronic component shielding method described in JP 2012-151326A includes: sealing a semiconductor device mounted on a substrate by a sealing resin containing filler; exposing a part of the filler by trimming a surface of the sealing resin; etching the exposed filler to form a hole in the surface of the sealing resin; and forming a metal film on the surface of the sealing resin including the inner surface of the hole. According to this shielding method, anchor effect of the metal film is enhanced to improve adhesion of the metal film to the surface of the sealing resin. Further, since the metal film serving as an electromagnetic shielding layer is directly formed on the surface of the sealing resin, the size of the entire electronic component module including the electromagnetic shield can be reduced as compared to a case where the entire electronic component is surrounded by a metal plate.

However, forming the metal film on the surface of the electronic component module may brings about increase in light reflectance, so that when position detection is performed based on image recognition, an image recognition device cannot correctly recognize the electronic component module due to influence of halation, which may deteriorate position detection accuracy.

It is desired that the reflectance of the metal film is low so as to improve image recognition accuracy. As a method of reducing the reflectance of the metal film, a method of applying roughening treatment (blackening treatment) to the metal film is available. However, when such treatment is applied, the metal film is etched from the side surface thereof, which may cause a shield made of the metal film to be peeled off.

SUMMARY

It is therefore an object of the present invention to provide an electronic component module provided with a conductive film having high adhesion and low light reflectance.

As a result of intensive study for solving the above-described problems, the present inventors have developed an electronic component module including an electronic component, a sealing resin that seals the electronic component, a conductive film that covers the surface of the sealing resin, and a protective film that covers the surface of the conductive film, wherein the protective film is divided into a low reflective section and a conductive section, and the low reflective section does not contact the conductive film.

According to the present invention, there can be provided an electronic component module provided with a conductive film having high adhesion and low light reflectance.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 9 is a table for indicating the evaluation results of examples 1 to 5 and comparative examples 1 to 4.

DETAILED DESCRIPTION OF THE EMBODIMENTS

Preferred embodiments of the present invention will now be explained in detail with reference to the drawings.

Figure 1:
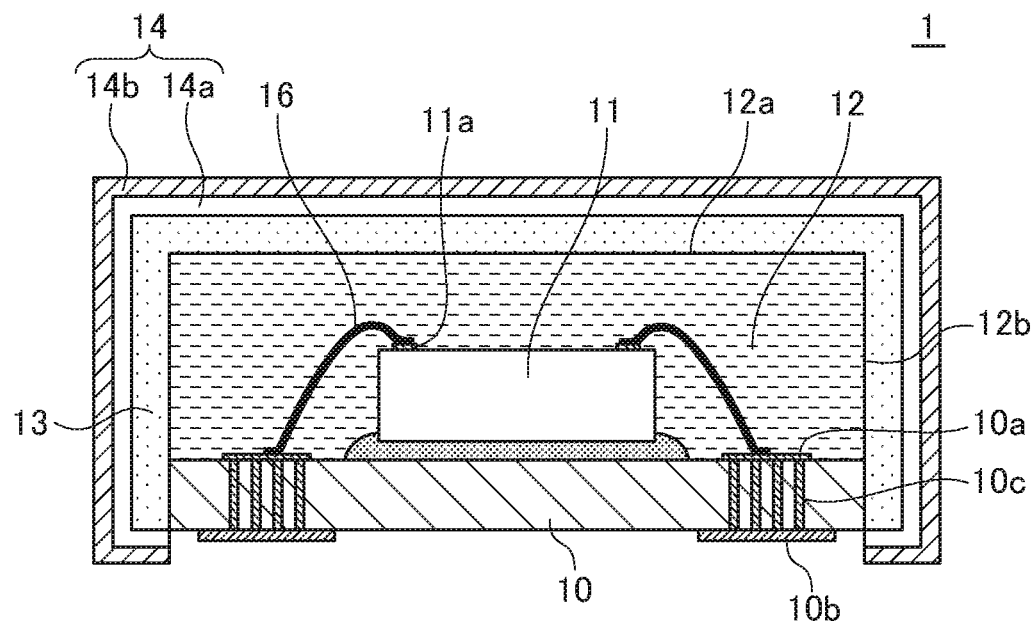
FIG. 1 is a schematic cross-sectional view illustrating the structure of an electronic component module according to a preferred first embodiment of the present invention.
Figure 2:
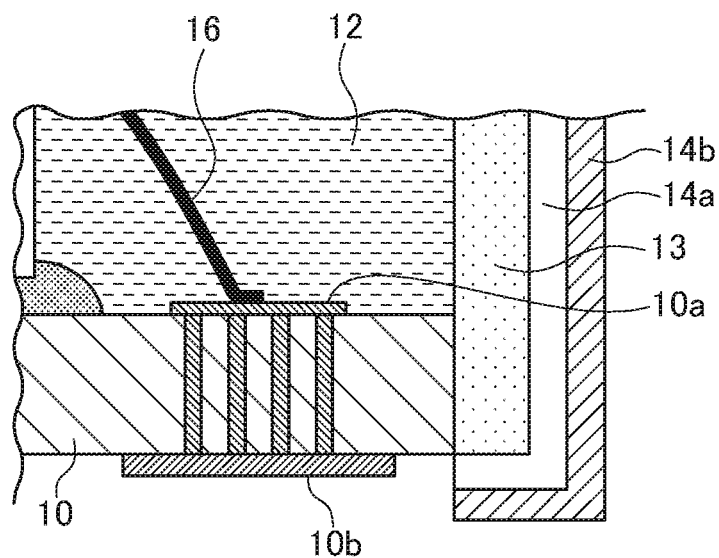
FIG. 2 is a partially enlarged view of the electronic component module shown in FIG. 1.

FIG. 1 is a schematic cross-sectional view illustrating the structure of an electronic component module 1 according to the preferred first embodiment of the present invention. FIG. 2 is a partially enlarged view of the electronic component module 1.

As illustrated in FIGS. 1 and 2, the electronic component module 1 has a mounting substrate 10, an electronic component 11 mounted on the mounting substrate 10, a sealing resin (mold resin) 12 that seals the electronic component 11, a conductive film 13 that covers the exposed surface of the sealing resin 12, and a protective film 14 that covers the conductive film 13.

The mounting substrate 10 is a printed circuit board obtained by forming wiring patterns 10a and 10b on the front and back surfaces of an insulating substrate. As the insulating substrate, glass epoxy sheet such as FR4 (Flame Retardant Type 4) can be used but not limited thereto, and a ceramic substrate such as alumina, SiC, or aluminum nitride can also be used. The mounting substrate 10 has a through hole conductor 10c penetrating the insulating substrate to connect the wiring patterns 10a and 10b. The wiring pattern 10b on the back surface of the mounting substrate 10 is electrically connected to a pad electrode 11a of the electronic component 11 through the through hole conductor 10c and a bonding wire 16.

The electronic component 11, a typical example of which is a semiconductor IC chip, is mounted on the mounting substrate 10 by soldering. The pad electrode 11a of the electronic component 11 is connected to the wiring pattern 10a through the bonding wire 16. The electronic component 11 may be a discrete component such as a chip capacitor or a chip conductor. Further, a plurality of electronic components 11 may be mounted on the mounting substrate 10.

The sealing resin 12 plays a role of protecting the electronic component 11 from external stress, moisture, contaminated matters, and the like. As a material of the sealing resin 12, epoxy resin can be used. The sealing resin 12 may contain filler composed of oxide particles, whereby reduction in thermal expansion coefficient and improvement in thermal conductivity can be achieved.

The conductive film 13 serves as an electromagnetic wave shield that blocks electromagnetic wave noise entering the electronic component 11 and electromagnetic field noise radiated from the electronic component 11. The conductive film 13 covers the outer surface of the sealing resin 12. The outer surface of the sealing resin 12 mentioned here refers to exposed surfaces of the sealing resin 12 in a state where the conductive film 13 is not formed, i.e., a top surface 12a of the sealing resin 12 positioned on the side opposite to the mounting surface (top surface of the mounting substrate 10) of the electronic component 11 and four side surfaces 12b of the sealing resin 12 perpendicular to the mounting surface. The conductive film 13 is formed on the entire exposed surface of the sealing resin 12, that is, not only on the top surface 12a but also on the side surfaces 12b, so that shielding effect can be enhanced. The conductive film 13 is also formed on the side surfaces of the mounting substrate 10.

As a material of the conductive film 13, Cu is preferably used. Cu has high conductivity and is advantageous in terms of workability and cost, so that it is preferably used as a material of the electromagnetic wave shield.

The conductive film 13 may be an alloy film having Cu as amain component. In this case, the alloy film preferably further contains at least one metal selected from a group consisting of Ni, Co, and Fe. When a metal film having Cu as a main component further contains at least one metal selected therefrom, stress of the conductive film 13 can be reduced.

The protective film 14 has a two-layer structure in which a protective layer 14a and a low reflective layer 14b are laminated in this order. The low reflective layer 14b is a layer having a lower light reflectance than that of the conductive film 13 and preferably has a light reflectance of less than 20%. This can reduce halation to thereby improve image recognition accuracy. The low reflective layer 14b can be obtained by forming a rough surface by a plating method or an etching method, or by roughening a smooth surface.

Figure 3A:
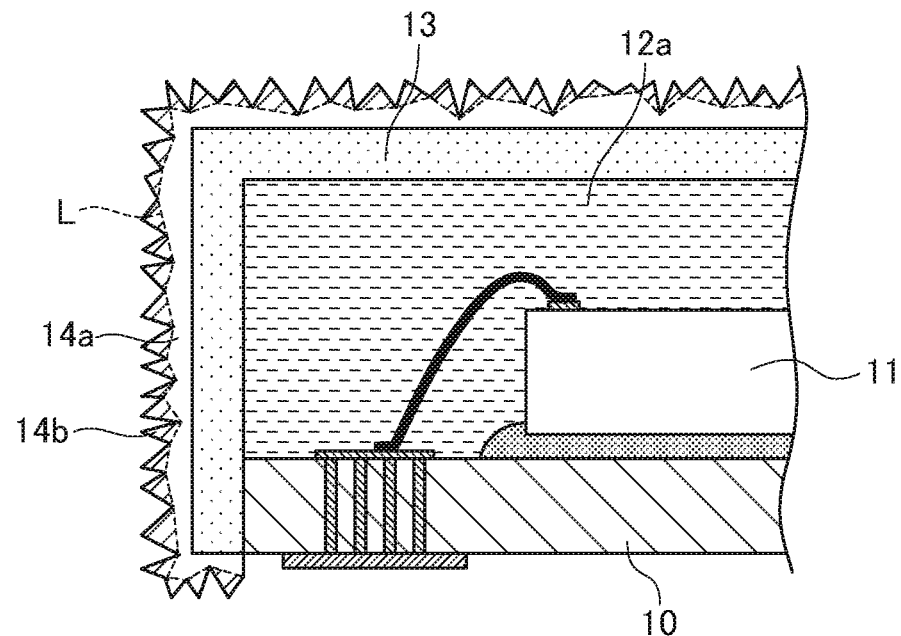
FIGS. 3A and 3B are schematic diagrams for explaining the boundary between a protective layer and a low reflective layer.
Figure 3B:
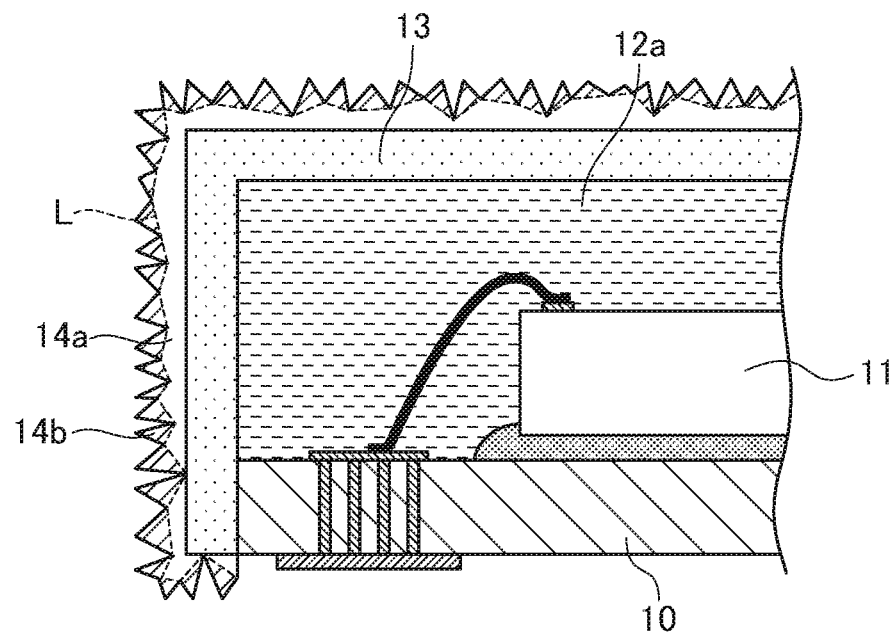

As illustrated in FIG. 3A, when the low reflective layer 14b is formed by roughening the surface of the protective film 14, a line L connecting concave portions formed in the surface of the protective film 14 is defined as the boundary between the protective layer 14a and the low reflective layer 14b. The boundary does not reach the conductive film 13. That is, the low reflective layer 14b and the conductive film 13 do not directly contact each other, and the protective layer 14a is surely interposed therebetween. On the other hand, as illustrated in FIG. 3B, which is a comparative example, when the line L representing the boundary reaches the conductive film 13, the low reflective layer 14b and the conductive film 13 contact each other, with the result that a portion where the protective layer 14a is not interposed between the low reflective layer 14b and the conductive film 13 is generated.

As a material of the protective layer 14a, Ni is preferably used. Ni has high corrosion resistance and thus has an effect to suppress corrosion of a conductive film 13.

The protective layer 14a may be an alloy film having Ni as a main component. In this case, the alloy film preferably contains P (phosphorus). The concentration of P is preferably in the range of 2 atom % to 19 atom %. When the concentration of P is set in this range, high corrosion resistance and high wear resistance can be obtained.

Figure 4A:
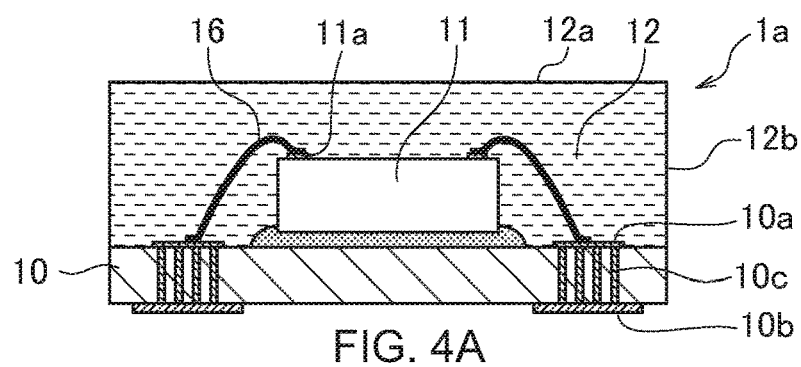
FIGS. 4A to 4D and FIGS. 5A to 5C are views for explaining a manufacturing method for the electronic component module shown in FIG. 1.

FIGS. 4A to 4D and FIGS. 5A to 5C are views for explaining a manufacturing method for the electronic component module 1. First, as illustrated in FIG. 4A, an electronic component module 1a as an intermediate product in which the electronic component 11 is mounted on the mounting substrate 10 and sealed by the sealing resin 12 containing filler is prepared (step 1).

Figure 4B:
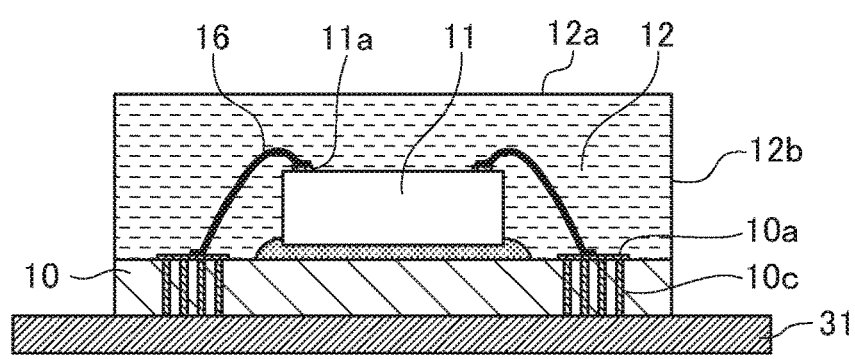

Then, as illustrated in FIG. 4B, a masking tape 31 is stuck to the back surface of the mounting substrate 10 constituting the electronic component module to cover the wiring pattern 10b formed on the back surface of the mounting substrate 10 (step 2). The planer size of the masking tape 31 is larger than that of the mounting substrate 10 and, thus, the entire back surface of the mounting substrate 10 is covered with the masking tape 31.

Figure 4C:
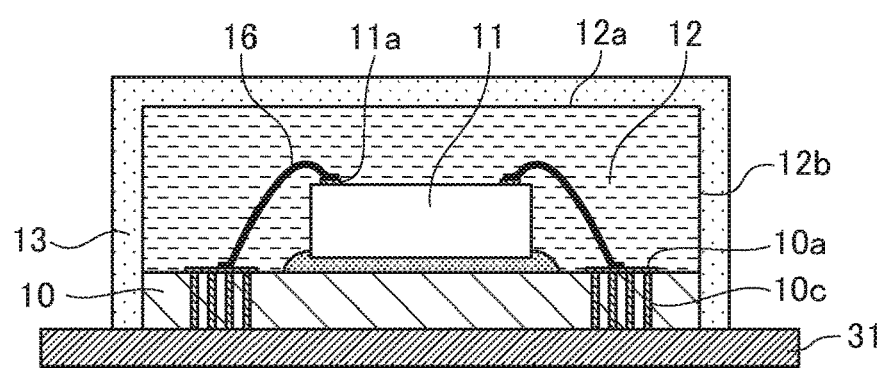

Then, as illustrated in FIG. 4C, the conductive film 13 having Cu as a main component is formed on the surface of the sealing resin 12 (step 3).

Figure 4D:
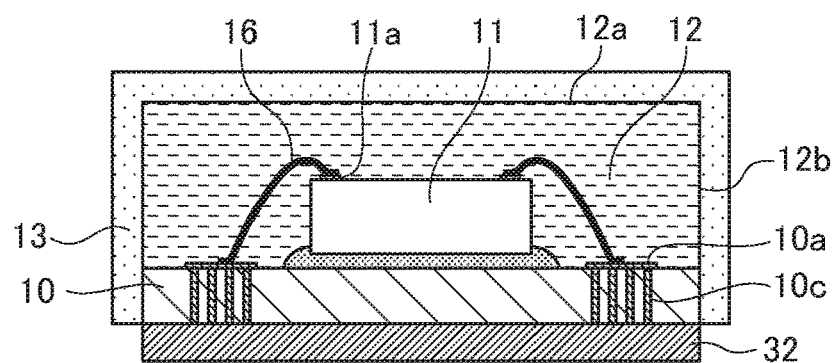

Then, as illustrated in FIG. 4D, the masking tape 31 is removed, and the wiring pattern 10b formed on the back surface of the mounting substrate 10 is covered with another masking tape 32 (step 4). At this time, the masking tape 32 having a size smaller than that of the masking tape 31 is used so as to allow end faces of the conductive film 13, i.e., surfaces of the conductive film 13 contacting the masking tape 31 to be exposed. The planar size of the masking tape 32 may be the same as that of the mounting substrate 10. In this case, the entire back surface of the mounting substrate 10 is covered with the masking tape 32.

Figure 5A:
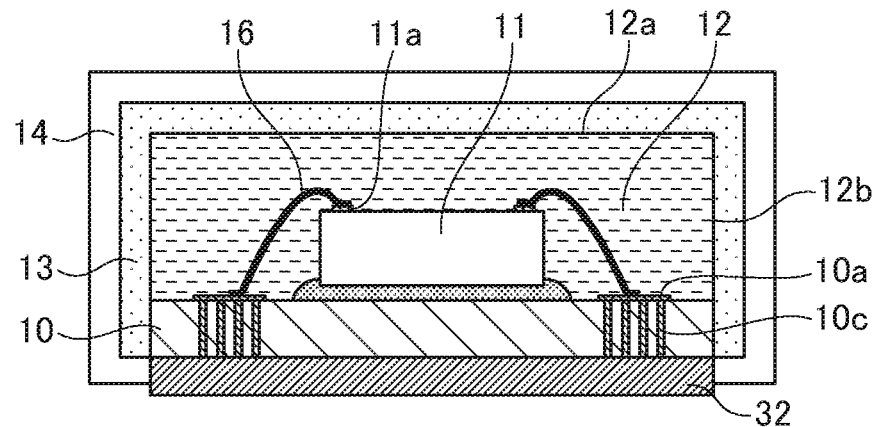

Then, as FIG. 5A, the protective film 14 having Ni as a main component is formed on the surface of the conductive film 13 (step 5).

The method for forming the conductive film 13 or protective film 14 is not especially limited, and an electroless plating method, a sputtering method, a printing method or the like may be used.

Figure 5B:
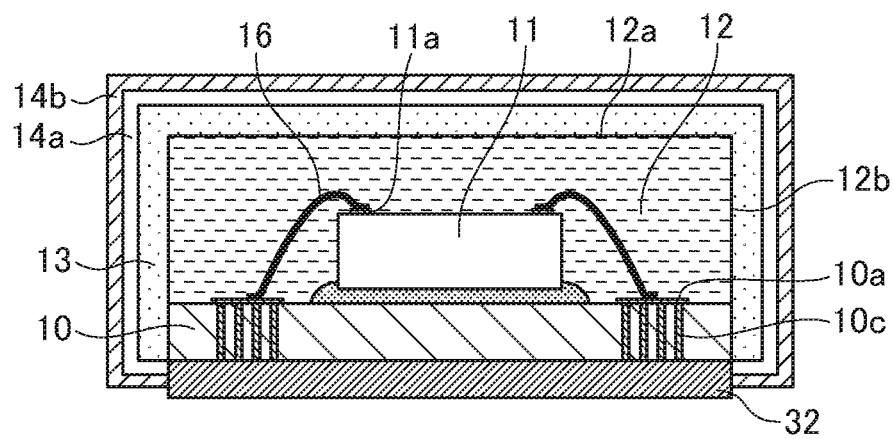

Then, as illustrated in FIG. 5B, blackening treatment is applied to the protective film 14 to turn the surface of the protective film 14 into the low reflective layer 14b (step 6). A part of the protective film 14 that is not turned into the low reflective layer 14b serves as the protective layer 14a.

The blackening treatment may be achieved by an electroless plating method or an etching method. The reason that the low reflective layer 14b is formed by the electroless plating method is that deposits resulting from the electroless plating are accumulated on the surface of the protective film 14 to form unevenness thereon. In order to reduce halation, the surface of the low reflective layer 14b is preferably rougher.

Figure 5C:
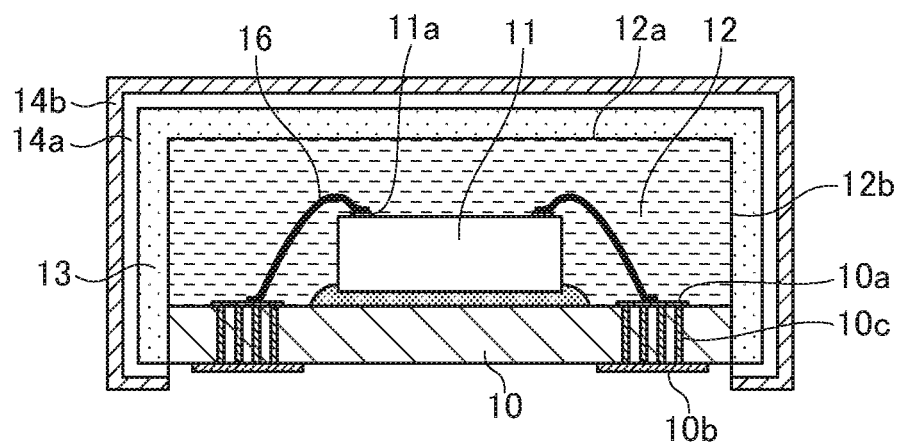

Then, as illustrated in FIG. 5C, the masking tape 32 is removed (step 7).

By the above way, the electronic component module 1 having a structure in which the surface of the sealing resin 12 is covered with the conductive film 13 is completed. In the electronic component module manufacturing method according to the present embodiment, the conductive film 13 is formed with the entire back surface of the mounting substrate 10 covered with the masking tape 31 having a large planar size, followed by removal of the masking tape 31, and the protective film 14 is formed with the entire back surface of the mounting substrate 10 covered with the masking tape 31 having a small planar size. Thus, the end faces of the conductive film 13 can be completely covered with the protective film 14.

Figure 6:
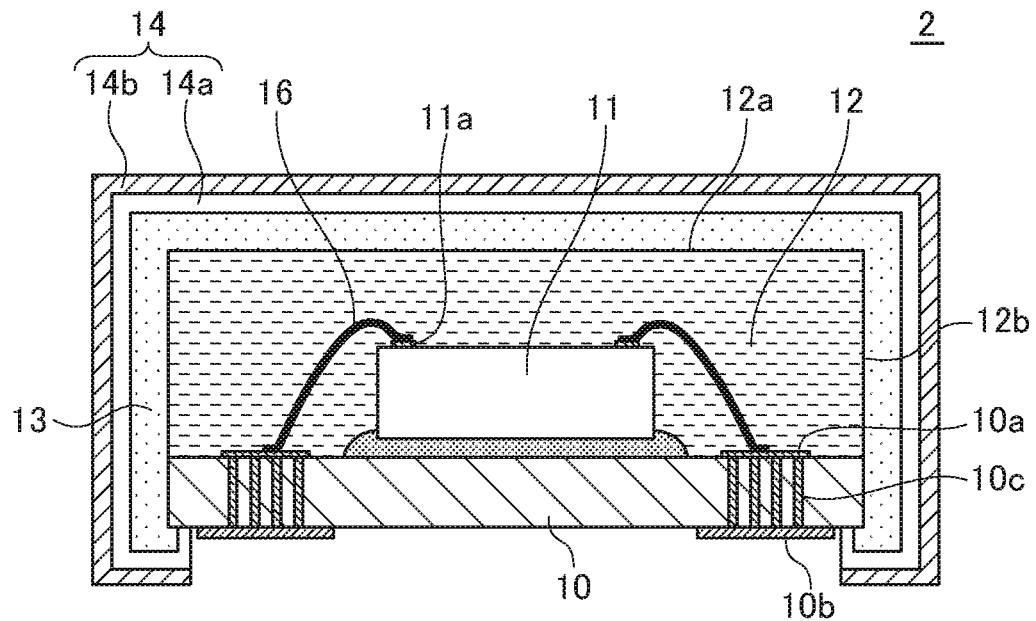
FIG. 6 is a schematic cross-sectional view illustrating the structure of an electronic component module according to a preferred second embodiment of the present invention.
Figure 7:
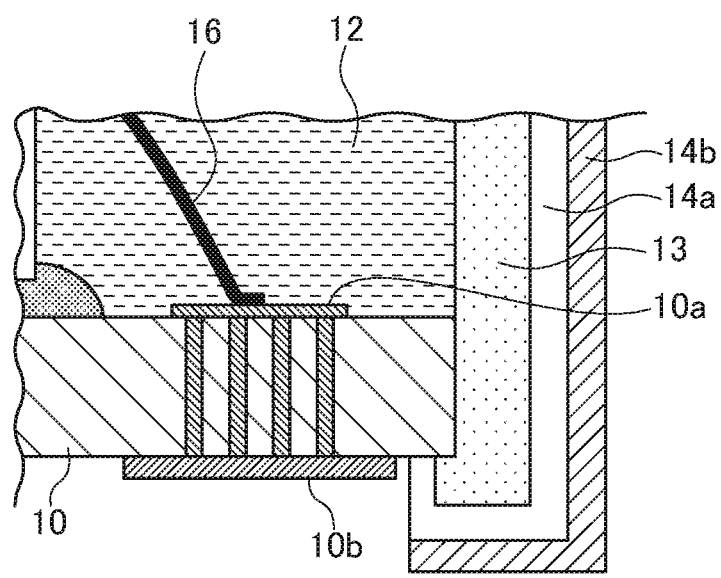
FIG. 7 is a partially enlarged view of the electronic component module shown in FIG. 6.

FIG. 6 is a schematic cross-sectional view illustrating the structure of an electronic component module 2 according to the preferred second embodiment of the present invention. FIG. 7 is a partially enlarged view of the electronic component module 2.

As illustrated in FIGS. 6 and 7, the electronic component module 2 differs from the above-described electronic component module 1 in that the conductive film 13, protective layer 14a, and low reflective layer 14b are partially turned to the back surface of the mounting substrate 10. Other configurations are the same as those of the electronic component module 1, so the same reference numerals are given to the same elements, and overlapping description will be omitted. According to the electronic component module 2 of the present embodiment, adhesion of the conductive film 13 is further enhanced, so that peeling-off of the conductive film 13 is less likely to occur. The end faces of the protective layer 14a formed on the back surface of the mounting substrate 10 may be exposed without being covered with the low reflective layer 14b.

The electronic component module 2 according to the present embodiment can be produced by making the width of the masking tape 32 illustrated in FIG. 4D smaller than the width of the mounting substrate 10.

While the preferred embodiments of the present invention have been described, the present invention is not limited to the embodiments but may be variously modified without departing from the spirit of the present invention, and all such modifications are included in the present invention.

EXAMPLES

Examples 1 to 5

Samples of Examples 1 to 4 each having the same structure as that of the electronic component module 1 shown in FIG. 1 and a sample of Example 5 having the same structure as that of the electronic component module 2 shown in FIG. 6 were produced.

First, samples of an electronic component module as an intermediate product in which an electronic component is mounted on a mounting substrate and sealed with a sealing resin (mold resin) containing filler composed of silica were prepared (see FIG. 4A). As the mounting substrate, a resin printed wiring board of FR4 (Flame Retardant Type 4) was used.

Then, a masking tape was stuck to the bottom surface of the mounting substrate to cover the entire bottom surface of the mounting substrate (see FIG. 4B). Subsequently, a conductive film was formed by an electroless plating method (see FIG. 4C). In the electroless plating process, the electronic component module was immersed in an aqueous solution containing colloid of Sn and Pd for five minutes, followed by washing with pure water. Then, the electronic component module was immersed in an electroless Cu plating solution for 50 minutes, followed by washing with pure water. As a result, a Cu film with a thickness of 2.0 μm was obtained.

Next, the masking tape was removed, and then another masking tape was stuck again to cover a wiring pattern so as to expose the end faces of the previously formed Cu film (see FIG. 4D). At this time, the masking tape having the same planar size as that of the mounting substrate was used for the samples of Examples 1 to 4. On the other hand, the masking tape having a planar size smaller than that of the mounting substrate was used for the sample of Example 5 to cover only the center portion surrounded by the outermost portion of the back surface of the mounting substrate (that is, only the center portion surrounded by the outermost portion was exposed).

Then, the electronic component module was immersed in an aqueous solution containing Pd ions for five minutes, followed by washing with pure water. Then, the electronic component module was immersed in an electroless Ni plating solution for 10 minutes, followed by washing with pure water. As a result, a Ni film with a thickness of 2.0 μm was obtained (see FIG. 5A). In the sample of Example 5, the planar size of the masking tape was smaller than that of the mounting substrate, so that the Ni film was formed also in the outermost portion of the back surface of the mounting substrate.

Then, the electronic component module was immersed in a 10% aqueous solution of sodium persulfate to apply blackening treatment to the electroless Ni plating (see FIG. 5B). As a result, the surface of the electroless Ni plating was turned into a low reflective layer. The samples of Examples 1 to 5 were produced by changing the blackening treatment time. Finally, the masking tape was removed (see FIG. 5C).

Comparative Example 1

A sample of Comparative Example 1 was produced in the same procedure except that formation of the low reflective layer by the blackening treatment was omitted.

Comparative Examples 2, 3, 4

Samples of Comparative Examples 2 to 4 each having the same structure as that of the electronic component module of FIG. 3B were produced.

First, samples of an electronic component module as an intermediate product in which an electronic component was mounted on a mounting substrate and sealed with a sealing resin (mold resin) containing filler composed of silica were prepared (see FIG. 4A). As the mounting substrate, a resin printed wiring board of FR4 (Flame Retardant Type 4) was used.

Figure 8A:
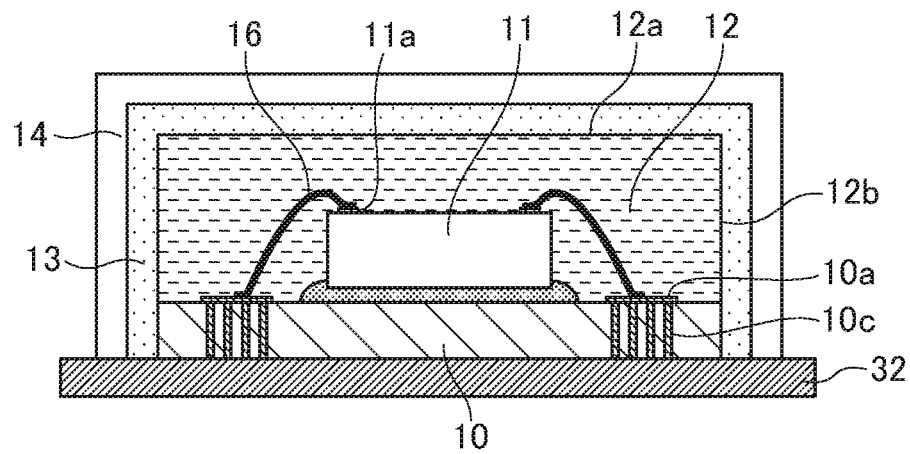
FIGS. 8A to 8C are views for explaining a manufacturing method for the electronic component module of the comparative examples.

Then, a masking tape was stuck to the bottom surface of the mounting substrate to cover the entire bottom surface of the mounting substrate (see FIG. 4B). Subsequently, a conductive film was formed by an electroless plating method (see FIG. 4C). In the electroless plating process, the electronic component module was immersed in an aqueous solution containing colloid of Sn and Pd for five minutes, followed by washing with pure water. Then, the electronic component module was immersed in an electroless Cu plating solution for 50 minutes, followed by washing with pure water. As a result, a Cu film with a thickness of 2.0 μm was obtained. Then, the electronic component module was immersed in an aqueous solution containing Pd ions for five minutes while the masking tape was stuck to the bottom surface of the mounting substrate, followed by washing with pure water. Then, the electronic component module was immersed in an electroless Ni plating solution for 10 minutes, followed by washing with pure water. As a result, a Ni film with a thickness of 2.0 µm was obtained (see FIG. 8A).

Figure 8B:
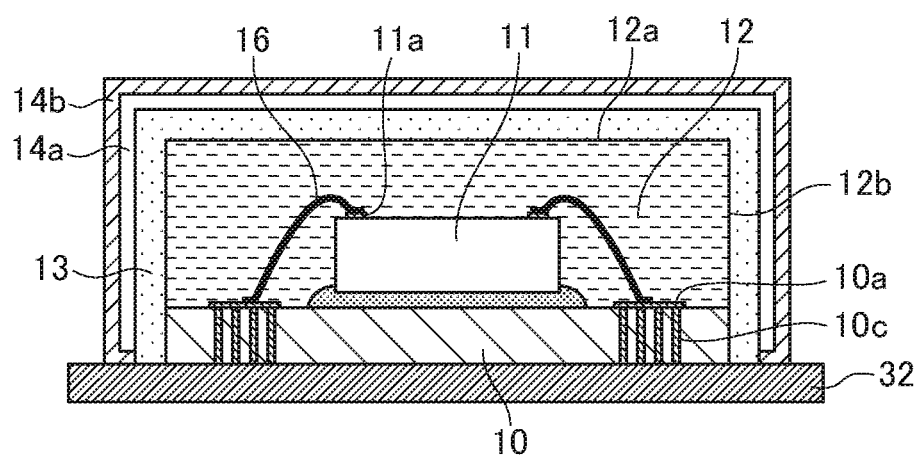
Figure 8C:
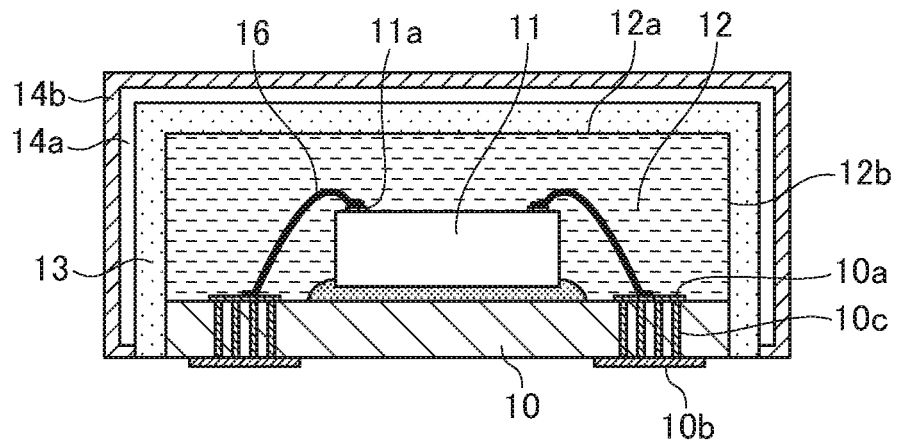

Then, the electronic component module was immersed in a 10% aqueous solution of sodium persulfate to apply blackening treatment to the electroless Ni plating (see FIG. 8B). As a result, the surface of the electroless Ni plating was turned into a low reflective layer. The samples of Comparative Examples 2 to 4 were produced by changing the blackening treatment time. Finally, the masking tape was removed (see FIG. 8C).

For the produced samples of Examples 1 to 5 and Comparative Examples 1 to 4 of the electronic component modules, an image analysis test and a tape-peel test were conducted. As a visible light reflectance, spectrophotometer CM-5 (made by Konica Minolta) was used to measure reflecting light in a wavelength range of 360 nm to 740 nm, and the obtained average value was evaluated. For the low reflective layer, cross section polishing was performed, and the boundary between the protective layer and the low reflective layer was evaluated. When the boundary was not visible, the boundary was defined by the line connecting the bottoms of the cross-sectional convex portions (outside the line is the low reflective layer and inside the line is the protective layer) (see the dashed line L of FIGS. 3A and 3B), and whether the bottom of the concave portion of the low reflective layer reaches the conductive film was evaluated. Image analysis was repeatedly performed ten times for the same portion of each sample, and evaluations were made as follows in terms of displacement of a detection position with respect to the position of the sample side surface: displacement of 10 µm or less is "⊚", displacement of 20 µm or less is "○", displacement of 50 µm or more is "x".

The adhesion was evaluated such that an adhesive tape was firmly stuck to the bottom surface of the sample and then removed at an angle close to 60° taking 0.5 sec. to 1.0 sec. about three minutes after the sticking.

After the removal of the adhesive tape, the state of the surface of a metal film was visually checked. The adhesion (peeled-off state) of the metal film to the sealing resin was evaluated on a scale of 1 to 5 as described below.

Rank "1" on the scale of 1 to 5 indicates that a small portion of the metal film came off (peeling rate is less than 5%); "2" indicates that the peeling rate of the metal film is about 5% to 15%; "3" indicates that a large part of the metal film partially or completely came off, and/or that the metal film partially or completely came off (peeling rate is about 15% to 35%); "4" indicates that a large piece of the metal film partially or completely came off, and/or that the metal film partially or completely came off (peeling rate is about 35% or more); "5" indicates that the peeling rate is higher than that of "4". The metal films ranked as "1" and "2" were judged to be excellent in adhesion. The metal films ranked as "3", "4", and "5" were judged to be poor in adhesion.

The results are shown in FIG. 9. It is found in FIG. 9 that the sample of Comparative Example 1 is good in adhesion of the conductive film, but reflectance is so high that a displacement exceeds 20 µm in image recognition. The samples of Comparative Examples 2 to 4 are low in reflectance but poor in adhesion. The samples of Examples 1 to 4 are good in both image recognition accuracy and adhesion. Particularly, the sample of Example 5 is good in image recognition accuracy and by far the best among the others in terms of adhesion.

What is claimed is:

1. An electronic component module comprising:
   an electronic component;
   a mold resin that seals the electronic component;
   a conductive film that covers the mold resin; and
   a protective film that covers the conductive film,
   wherein the protective film includes a protective layer and a low reflective layer that comprises a rough outer surface defining convex portions and concave portions that are configured such that bottoms of the concave portions of the low reflective layer reach the protective layer to expose parts of the protective layer;
   wherein the low reflective layer is free from contact with the conductive film.

2. The electronic component module as claimed in claim 1, wherein the low reflective layer has a light reflectance of less than 20%.

3. The electronic component module as claimed in claim 1, further comprising a substrate having front and back surfaces,
   wherein the electronic component is mounted on the front surface of the substrate, and
   wherein the conductive film and the protective film are partially covering the back surface of the substrate.

4. The electronic component module as claimed in claim 1, wherein the end faces of the conductive film are completely covered with the protective film.

5. The electronic component module as claimed in claim 1, wherein the protective layer and the low reflective layer comprises Ni.

6. The electronic component module as claimed in claim 1, wherein the rough outer surface of the low reflective layer is formed by one of an electroless plating and an etching method.

7. The electronic component module as claimed in claim 1, wherein the rough outer surface of the low reflective layer is configured to reduce halation.

* * * * *